US008467239B2

(12) United States Patent
Kalb et al.

(10) Patent No.: US 8,467,239 B2
(45) Date of Patent: Jun. 18, 2013

(54) REVERSIBLE LOW-ENERGY DATA STORAGE IN PHASE CHANGE MEMORY

(75) Inventors: Johannes A. Kalb, San Francisco, CA (US); Brett E. Klehn, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 12/958,502

(22) Filed: Dec. 2, 2010

(65) Prior Publication Data

US 2012/0140553 A1 Jun. 7, 2012

(51) Int. Cl.
*G11C 11/09* (2006.01)

(52) U.S. Cl.
USPC .......................................... 365/163; 365/148

(58) Field of Classification Search
USPC .................................. 365/148, 163
See application file for complete search history.

(56) References Cited

U.S. PATENT DOCUMENTS

| | | | |
|---|---|---|---|
| 7,135,696 B2 | 11/2006 | Karpov et al. | |
| 7,233,054 B1 | 6/2007 | Anh et al. | |
| 7,359,231 B2 | 4/2008 | Venkataraman et al. | |
| 7,573,058 B2 | 8/2009 | Noh et al. | |
| 2004/0113137 A1 | 6/2004 | Lowrey | |
| 2006/0073652 A1 | 4/2006 | Pellizzer et al. | |
| 2006/0227592 A1 | 10/2006 | Parkinson et al. | |
| 2007/0041245 A1 | 2/2007 | Ahn | |
| 2007/0221905 A1 | 9/2007 | Liu | |
| 2008/0310211 A1* | 12/2008 | Toda et al. ................... 365/148 |
| 2009/0072218 A1 | 3/2009 | Savransky et al. | |
| 2009/0114898 A1 | 5/2009 | Ricker | |
| 2010/0182827 A1 | 7/2010 | Kostylev et al. | |
| 2010/0214829 A1* | 8/2010 | Breitwisch et al. ........... 365/163 |
| 2010/0232205 A1 | 9/2010 | Parkinson | |
| 2011/0134685 A1 | 6/2011 | Kau et al. | |

FOREIGN PATENT DOCUMENTS

| | | |
|---|---|---|
| CN | 1841558 A | 10/2006 |
| TW | I296435 | 5/2006 |
| WO | 2011/071594 A2 | 6/2011 |
| WO | 2011/071594 A3 | 8/2011 |

OTHER PUBLICATIONS

Kau, et al., "A stackable cross point phase change memory", IEEE, Proceedings of the 2009 IEEE International Electron Devices Meeting, Baltimore, MD, Dec. 9, 2009, pp. 27.1.1-27.1.4.

International Preliminary Report for PCT Patent Application No. PCT/US2010/052833, mailed on Jun. 21, 2012, 6 pages.

Czubatyj, et al., "Current Reduction in Ovonic Memory Devices," Proceedings of the European Phase Change and Ovonic Science Symposium, Grenoble, France, May 2006, pp. 1-10.

Ferdinando, et al., "A Bipolar-Selected Phase Change Memory Featuring Multi-Level Cell Storage", IEEE Journal of Solid-State Circuits, vol. 44, No. 1, Jan. 2009, pp. 217-227.

(Continued)

*Primary Examiner* — Hoai V Ho
(74) *Attorney, Agent, or Firm* — Cool Patent, P.C.

(57) ABSTRACT

A phase change memory (PCM) device utilizes low energy pulses to write data to PCM storage elements (cells). Methods, devices and systems are described that use low energy reset pulses to reset cells that have been previously set using a method that keeps a portion of the PCM cells in an amorphous phase. The reset is reversible by utilizing a low energy set pulse.

19 Claims, 5 Drawing Sheets

OTHER PUBLICATIONS

International Search Report and Written Opinion for PCT Patent Application No. PCT/US2010/052833, Mailed on Jul. 1, 2011, 9 pages.

Notice of Allowance for U.S. Appl. No. 12/653,092, mailed Jun. 12, 2012.

Notice of Allowance for U.S. Appl. No. 12/653,092, mailed Sep. 7, 2012.

Notice of Allowance for U.S. Appl. No. 12/653,092, mailed Oct. 2, 2012.

Notice of Allowance for U.S. Appl. No. 12/653,092, mailed Nov. 2, 2012.

Office Action received for Chinese Patent Application No. 201010584054.9, mailed on Feb 5, 2013, 16 pages, including 9 pages of English translation.

* cited by examiner

REVERSIBLE LOW-ENERGY DATA STORAGE IN PHASE CHANGE MEMORY

TECHNICAL FIELD

The present subject matter relates generally a field of electronics including semiconductor memory devices. More specifically, the present subject matter relates to phase change memory devices.

BACKGROUND

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory. Phase change memory devices utilize materials that have different electrical properties in their crystalline and amorphous phases. Each phase change memory cell may be programmed by putting the material in the memory cell into either a crystalline phase or an amorphous phase providing non-volatile memory that does not require power to retain its contents. Phase change memories are often programmed using heat generated by an electrical current to control the state of the phase change material.

Phase change memory cells may be made from chalcogenide materials. Chalcogenide materials include at least one element from Group VI A of the periodic table. Chalcogenide phase change material, when heated to a temperature above its melting point and allowed to cool quickly, will remain in an amorphous glass-like state with a high electrical resistance. The chalcogenide phase change material, when heated to a temperature above its glass transition temperature $T_g$ but below the melting point, will transform into a crystalline phase with a much lower resistance. This difference in the material properties between the amorphous and crystalline phases of chalcogenide materials may be used to create a phase change memory device.

BRIEF DESCRIPTION OF THE DRAWINGS

The accompanying drawings, which are incorporated in and constitute part of the specification, illustrate various embodiments of the claimed subject matter. Together with the general description, the drawings serve to explain the principles of the claimed subject matter. They should not, however, be taken to limit the claimed subject matter to the specific embodiments described, but are for explanation and understanding of the claimed subject matter. Such subject matter may be understood by reference to the following detailed description when read with the accompanying drawings in which:

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of the claimed subject matter. These descriptive terms and phrases are used to convey a generally agreed upon meaning to those skilled in the art unless a different definition is given in this specification.

Figure 1A:
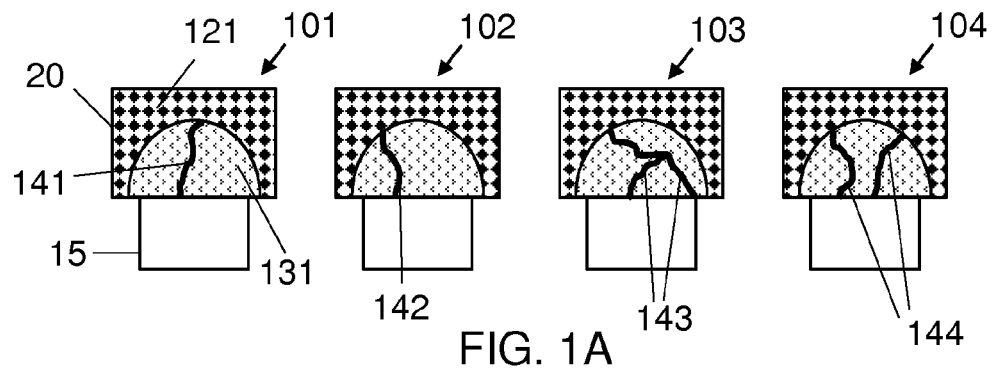
FIG. 1A shows cross-sections of a collection of phase change memory (PCM) storage elements (or cells) in a "set" state.

FIG. 1A shows a cross-section of a collection of phase change memory (PCM) storage elements (or cells) 101-104 in a "set" or low resistance state. The drawings show a somewhat stylized view of the PCM cells 101-104 and should not be taken as a detailed physical representation. The cells 101-104 should also be interpreted separately and no physical relationship between the individual cells is intended in FIG. 1A-1D.

Phase change memory (PCM) devices utilize storage elements such as storage elements 101-104 that are made of phase change material. A phase change material remains stable locally in one of the two phases or in a combination of the two phases over an operating temperature range and exhibits different electrical properties in the amorphous phase than in the crystalline phase. In various embodiments, the phase change material may include two properties: one, the phase change material can exist locally in an amorphous phase without crystallization for a prolonged period of time, such as for several years, at room temperature; and two, the amorphous phase can crystallize rapidly if temperature is raised. In general, a crystallization time of the phase change material decreases with increasing temperature. For example, if an amorphous PCM storage element of one embodiment is heated up to ~150 degrees Celsius (C), the PCM storage element may crystallize within a minute or so. If the embodiment of the amorphous PCM is heated quickly up to ~200 C, it may crystallize within a second. If the embodiment of the amorphous PCM is heated very quickly up to ~300 C, such as by a pulse, the PCM storage element may crystallize within a microsecond or even faster. For the phase change material, the crystalline phase is energetically more favorable (lower free energy) than the amorphous phase. However, if a crystalline volume of the embodiment of the PCM is heated above the melting temperature of the PCM, such as to a temperature>~650 C, and allowed to then cool quickly, the phase change material may revert to an amorphous phase.

A large variety of phase change material types with widely differing properties may be selected for the PCM storage element. The phase change material may include a stoichiometric or a non-stoichiometric compound. The phase change material may include a eutectic or a peritectic material. The phase change material may include single-phase or multiphase materials. The phase change material may be doped with various elements. In various embodiments, the phase change material may have a binary composition, a ternary composition, or a quaternary composition. In another embodiment, the phase change material may have a pseudo-binary composition.

The phase change material is called a chalcogenide alloy if it includes at least one element from Group VI A of the periodic table. Group VI A of the periodic table includes elements such as sulfur (S), selenium (Se), and tellurium (Te). Phase change materials often also include elements from other groups of the periodic table, such as Group III A (gallium (Ga) and indium (In)), Group IV A (silicon (Si), germanium (Ge), and tin (Sn)), Group V A (phosphorus (P), arsenic (As), antimony (Sb), and bismuth (Bi)), Group I B (silver (Ag) and gold (Au)), and/or Group VIII B (cobalt (Co) and palladium (Pd)). Examples of chalcogenide phase change materials include GeSbTe, GaSbTe, and InSbTe, although the scope of the claimed subject matter is not limited in this respect.

In electronic systems, energy consumption for a given operation may be decreased to reduce the cost of operating the device, the cost of the power supplies to power the device, and the cost of cooling solutions to remove the heat generated, and furthermore tends to increase reliability as most electronic systems operate more reliably at lower temperatures. This is particularly true for those electronic devices with a finite energy source such as battery operated stations including cell phones, mobile internet devices, netbooks, and other mobile devices. Phase change memory (PCM) devices are no exception. The PCM devices utilize PCM storage elements and may be, in some embodiments, combined with a switch, such as an ovonic threshold switch (OTS), to form a phase change memory with switch (PCMS) cell. Typically, a reset pulse (putting the cell into a high resistance state) provides enough energy to quickly melt the phase change material, which upon cooling puts the phase change material into an amorphous phase, while the set pulse (putting the cell into a low resistance state) heats the phase change material to a temperature above its glass transition temperature and holds it there long enough for most of the PCM cell to crystallize.

One example method of reducing the amount of energy involved for setting a PCM cell is described in U.S. application Ser. No. 12/653,092 filed on Dec. 8, 2009 titled "ENERGY-EFFICIENT SET WRITE OF PHASE CHANGE MEMORY WITH SWITCH" by Kau et al., which is hereby incorporated herein by reference in its entirely. The method described by Kau et al. creates a PCM cell that still has an amorphous volume of phase change material while in the low resistance set state. The low resistance may be caused by one or more crystalline filaments, conducting filaments, or partially crystallized regions in an otherwise amorphous volume. While the set process described by Kau at al. may not necessarily reduce the resistance of the phase change material to levels observed in conventional phase change memory set operations that put substantially all or nearly all of the phase change material of a PCM cell into a crystalline phase, the method may reduce the resistance and/or threshold voltage of the phase change material sufficiently to enable reliable detection the state of the PCM cell.

In one or more embodiments, representative cell 101 is used to describe some additional detail that also applies to cells 102-104. The representative cell 101 is made up of a volume of phase change material 20 as described above, and, in some embodiments, a heater 15 in series with the phase change material 20 and in thermal contact with the phase change material 20 (although some embodiments may not include a heater 15). In other embodiments, a switch (sometimes referred to as a snapback selector or an access element), such as an ovonic threshold switch (OTS) may also be included as a series element in the cells. Another conductor (not shown) is in electrical contact to the representative cell 101 on the opposite side from the heater element 15 and allows for a completed circuit through the representative cell 101. The volume of phase change material that is considered to be a part of the PCM cell may be the volume of phase change material between the two electrical contacts on the opposite sides of the phase change material bounded by the area of the smaller of the two electrical contacts.

The heater element 15, if present, further may include a conductor that is formed from a conductive material. The conductive material may comprise, but is not limited to, titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, or tantalum nitride (TaN), or combinations thereof, among other elements. Current flowing through the heater 15 creates heat due to the resistance of the heater 15 which may then transfer heat, such as through Joule heating, to the phase change material 20 during a set or reset write pulse or pulses. In embodiments without a heater, Joule heating occurs mostly in the storage element 20.

The phase change material 20 of one or more of representative PCM cell 101 may be divided into two volumes. The phase change material 20 may have a volume of crystalline phase change material 121, and a volume of amorphous phase change material 131. The amorphous volume in the phase change material 131 is shown as an amorphous hemisphere or dome in FIG. 1A-1D. Alternatively, other topologies may be used for the amorphous volume 131. For example, depending on the device architecture, the amorphous volume 131 may include an amorphous line (not shown) or an amorphous bridge (not shown). Also, other embodiments may even use a complete amorphization of the phase change material 20, leaving substantially no crystalline volume remaining, however the scope of the claimed subject matter is not limited in these respects.

The PCM cells 101-104 shown in FIG. 1A have been previously set using the low energy set method described by the incorporated Kau et al reference. In the set state created by the low energy set method, however, a conducting filament 141 may be formed in the representative cell 101, which may be a crystallized filament, filaments, or partially crystallized regions in the amorphous volume 131. It may or may not be formed by merging together a series of adjacent small localized crystal nucleation centers inside the amorphous volume 131. The conducting filament 141 may extend from the heater element 15, through the amorphous volume 131, to the crystalline volume 121 of representative cell 101. Similar conducting filaments 142-144 in the amorphous volume of the phase change material are also shown for the other PCM cells 102-104. The conducting filaments 141-144 lower the resistance, as well as a threshold voltage, of the PCM cells 101-104. In contrast, a more traditional high energy set pulse would crystallize nearly the entire volume of phase change material 20 so that very little to no amorphous volume 131 would remain after a set operation.

Because a volume of amorphous phase change material, which has a high resistance, is always or nearly always in place, some embodiments may eliminate one or more patterning steps on the phase change material layer during manufacturing. Such an approach may allow some costs to be reduced for devices using the techniques described herein. The large volume of amorphous material that is in place in both the set and reset states acts as an insulator, confining the current path to the conductive filament.

The low energy set pulse for the method described by Kau et al. may be as much as 10-100 times lower than an equivalent high energy set pulse. The amplitude and duration of the current for the low energy set pulse may vary widely depending on the embodiment, but may range from about 0.5% to about 20% of the current involved to substantially melt the phase change material of the PCM cell. The current involved to substantially melt the phase change material of the PCM cell depends on the architecture and the size of the PCM cell. In one embodiment, about 1.8-2 milliamperes (mA) may be involved to substantially melt the phase change material. For other embodiments with a much smaller cell or a different architecture, the current could be considerably lower than about 1.5 mA, such as about 0.2 mA in one embodiment and 15 microamperes (μA) in another embodiment. However, the low energy set current amplitude would then decrease proportionately so that about 0.5%-20% of the current involved to substantially melt the phase change material may still be sufficient to crystallize the conductive filament in the amorphous volume of the PCM cell.

A duration of current flow for a low energy set pulse described by Kau et al. depends on thermal conductivity of the phase change material 20, the heater 15 (if present), and the surrounding materials, the shape and size of the amorphous volume 131, and/or the device architecture (logical and physical layout) of a memory device using the PCM cells 101-104. In one embodiment, a low energy set pulse width (duration of current flow) is about 250-500 nanoseconds (ns). In another embodiment, a set pulse width is about 125-250 ns. In a further embodiment, the set pulse width is about 45-125 ns. In yet another embodiment, the set pulse width is about 10-45 ns. In some phase change materials, a pulse width may be as high as 500 ns, but the pulse amplitude is very low so a desired low energy or power may still be achieved.

The PCM cells 101-104, after the low energy set pulse, are in a low resistance state. While the resistance of the PCM cells may not be as low as a fully crystallized PCM cell, the PCM cells may have a resistance, in some embodiments, of between about 1 kilohm (kΩ) and about 50 kilohms in the set state although some embodiments may involve lower or higher resistance. In the set state, the PCM cells may have a threshold voltage ($V_T$) of less than about 0.5 volts (V) in most embodiments and may have a $V_T$ of less than about 0.2 V in some embodiments.

Figure 1B:
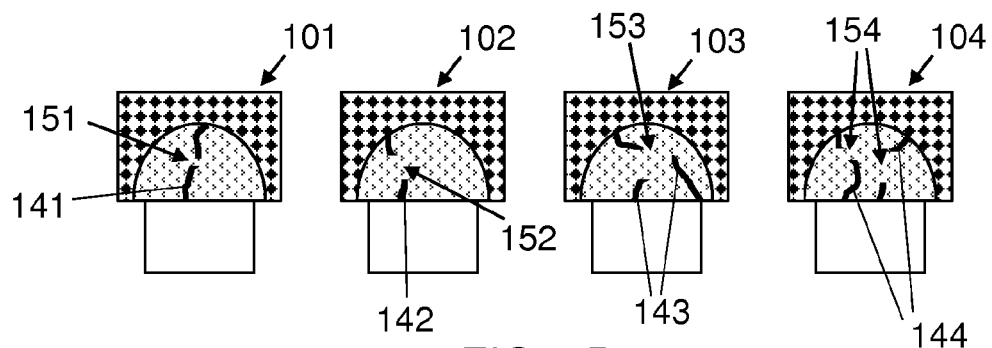
FIG. 1B shows the collection of PCM cells that have been reset using an embodiment of a low energy reset pulse.

FIG. 1B shows the collection of PCM cells 101-104 that have been put into a "reset" or high resistance state using an embodiment of a low energy reset pulse. Note that the conducting filaments 141-144 in the amorphous volumes of phase change material have been disrupted by breaks 151-154. The breaks 151-154 may be a section of the conducting filament that has melted and cooled back into an amorphous phase. Other physical phenomenon may also be disrupting the conducting filaments such as breaking up a series of adjacent small localized crystal nucleation centers inside the amorphous volume.

The cell temperature T obtained by Joule heating is monotonically increasing with increasing current density J, and the current density J is defined as a ratio of the electrical current I and the area A through which the current flows (J=I/A). Therefore, the cell temperature T is a monotonically increasing function of I/A. If the area A is much smaller, the current I, and therefore, the energy (since current and energy are proportional), involved to reach a given temperature such as the melting temperature during a reset pulse may be reduced proportionally. In the PCM cells 101-104 of FIG. 1A, the conducting area is limited to the conducting filaments. Since the cross-sectional areas of the conducting filaments 141-144 are relatively small, in various embodiments ranging from as large as about 25 square nanometers ($nm^2$) to as small as about 1 $nm^2$, the current involved to melt at least a portion of the conducting filaments 141-144 is significantly reduced as compared to the current involved to melt the full area of the heater, which may be in the range of 100-10,000 $nm^2$ using existing or near-term technology, depending on the embodiment.

Putting the PCM into the reset state simply involves melting followed by quenching (cooling quickly) at least some of the phase change material. In the very beginning of a reset pulse, during a transient time τ (typically around 10-20 ns depending on architecture and cell size), the steady state temperature distribution may not yet be reached, so the temperature of the phase change memory cell at any location still may be increasing with time. After the transient time τ has passed, but still during the duration of the reset pulse, the temperature profile of the cell may not be changing with time any more (steady state). The transient time depends primarily on the heat transfer properties of the material including the heat capacity and thermal conductivity and the heat loss characteristics of the embodiment. As long as the reset pulse width is longer than the transient time, the final cell temperature profile at the end of the pulse depends on current density J only and not on pulse width. Only if the reset pulse width is shorter than the transient time τ, a shorter pulse width may need to be compensated by a slightly higher current density J to reach the melting temperature, but the effect is small. After being melted, if the phase change material is cooled quickly (or quenched), the phase change material may harden into an amorphous state with little to no crystallization. So a pulse that does not have a high enough current to cause a particular volume of phase change material to reach the melting temperature cannot be made to melt the phase change material simply by making it longer.

In contrast to a reset pulse, the duration of the low energy set pulse described by Kau et al. is a factor, as crystallization of a phase change material from the amorphous phase is a kinetic phenomenon depending on both temperature T and time t. For crystallization to occur, whether in a large volume or in a narrow filament, a temperature greater than the glass transition temperature of the material but below the melting temperature is maintained for a long enough time for the molecules to organize themselves into stable structures or crystals. Crystallization may occur in such a temperature range because the atoms have enough mobility to rearrange to the energetically preferred crystalline phase. In general, a higher temperature may result in more mobility, and therefore in faster crystallization, as long as the melting temperature is not closely approached. Because of this, a lower amplitude set pulse may be compensated for by making the pulse longer in duration.

Note that the PCM cells 101-104 of FIG. 1B may not be completely transformed back to the reset state, or amorphous phase. Portions of the conducting filaments 141-144 may remain intact in the amorphous volume of the PCM cells 101-104. This may be due to the low energy reset pulse not having enough energy to re-melt a significant portion of the previously existing amorphous volume. In various embodiments, the low energy reset pulse may re-melt and amorphize only a relatively small amount of the crystalline phase change material within the conducting filament, and in most embodiments the low energy reset pulse may not re-melt a significant portion (for example less than about 10%) of the surrounding amorphous volume of phase change material of the PCM cell. However, the low energy reset pulse may disrupt the conducting filaments 141-144 enough that the overall properties of the PCM cells 101-104 are sufficiently equivalent to that of a PCM cell that has been reset with a traditional high energy reset pulse that melts a significant portion (for example greater than about 10%) of the phase change material of the PCM cell such as shown in FIG. 1C.

The low energy reset pulse may put the PCM cell 101-104 into a reset (or high resistance) state. In some embodiments, the resistance of the PCM cell (cell resistance) may be about 100 megohms (MΩ) after the low energy reset pulse has been applied. In other embodiments, the cell resistance may be as low as 1 MΩ. In some embodiments, a critical resistance ($R_C$) may be defined as the minimum cell resistance allowable for a reset PCM cell. In some embodiments, $R_C$ may be equal to 100 kΩ, although $R_C$ could be higher or lower in other embodiments. The low energy reset pulse may also increase the threshold voltage of the PCM $V_T$ to a level that is distinguishable from the set state. In many embodiments, $V_T$ may increase to over about 1 or 2 volts after the low energy reset pulse.

Figures 1C, 1D:
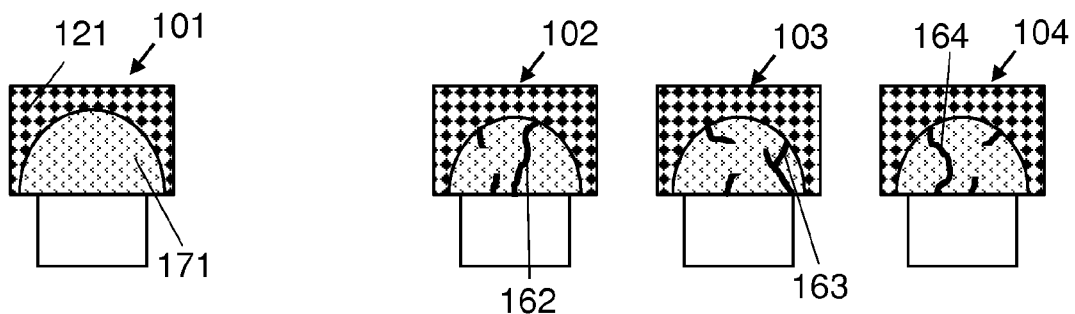
FIG. 1C shows a PCM cell that has been reset using a high energy reset pulse.
FIG. 1D shows a collection of PCM cells that have been set again after being reset using an embodiment of using a low energy reset pulse.

FIG. 1C shows a PCM cell 101 that may have been reset using a high energy reset pulse. In some embodiments, the PCM cell resistance after a low energy reset pulse may occasionally be lower than $R_C$. Such as situation may be caused by an accumulation of fragments of conducting filaments, operating conditions, or other causes. In such cases, some embodiments may provide a high energy reset pulse to recondition the amorphous volume 131 of the PCM cell 101 back to a more "pristine" condition. The high energy reset pulse may melt a significant portion (for example greater than about 10%) of the phase change material 20 in the PCM cell 100. After the high energy reset pulse is applied, the PCM cell 101 may have a fresh amorphous volume 171 of phase change material and it may still have a crystallized volume 121 of phase change material.

FIG. 1D shows a collection of PCM cells 102-104 that have been set using a low energy set pulse after having been reset using an embodiment of a low energy reset pulse. Conducting filaments 162-164 may be recreated in the amorphous volume of phase change material. In some cases, a new conducting filament 162 may form that does not use any portion of the fragments of conducting filament 142 that may remain after the low energy reset. In other cases, a new section of conducting filament 163 may connect to a remaining fragment of the conducting filament 143. In yet other cases, the same path may be used by the new conducting filament 164 as was used by the previous conducting filament 144 by re-crystallizing the portion of the conducting filament 144 that was disrupted by the low energy reset pulse.

Figure 2A:
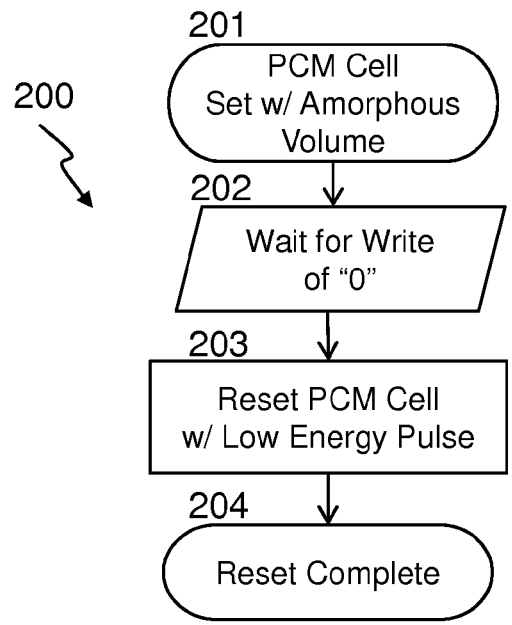
FIG. 2A-2C show flow charts of various embodiments of methods of using a low energy reset pulse for PCM cells.

FIG. 2A shows a flow chart 200 of an embodiment of a method of using a low energy reset pulse for PCM cells. In the embodiments shown in FIG. 2A-2C, a set PCM cell represents a binary "1" and a reset PCM cell represents a binary "0" but in other embodiments, the reverse may be true, and in other embodiments, some sections of the array may use a set cell to represent a "0" while other parts of the array may use a reset cell to represent a "0".

A PCM cell that has been previously set with a low energy set pulse, leaving an amorphous volume of phase change material in the PCM cell that is available at block 201. It may become necessary to set the PCM cell to a "0" at block 202. Determining whether or not any write to the PCM memory device may, in some embodiments, require first reading the value of the PCM cell to find out whether or not the stored value is changing, while other embodiments may simply perform the requested set or reset operation whenever a write occurs. A low energy reset pulse is sent to the PCM cell at block 203, causing the PCM cell to go to the high resistance state without melting a significant portion of the amorphous volume of the phase change material. The reset of the PCM cell is complete at block 204.

Figure 2B:
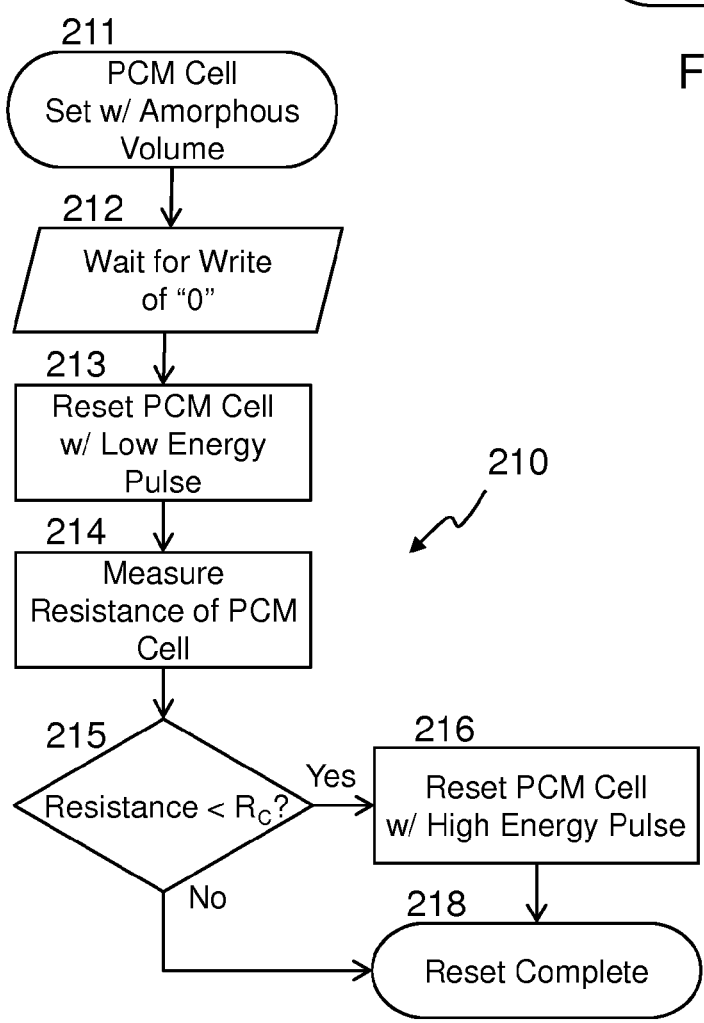

FIG. 2B shows a flow chart 210 of a somewhat more complicated embodiment of a method of using a low energy reset pulse for PCM cells. As in flow chart 200, a previously set PCM cell with an amorphous volume of phase change material is available at block 211 and it is determined that the PCM cell should be reset due to the need to write a "0" to the PCM cell at block 212. A low energy reset pulse is sent to the PCM cell at block 213, to reset the PCM cell to the high resistance state without melting a significant portion of the amorphous volume of the phase change material. In the embodiment shown in flow chart 210, it may be the case that occasionally, the low energy reset pulse does not completely reset the PCM cell, leaving the resistance of the PCM cell lower than the critical resistance $R_C$. So the resistance of the PCM cell is measured at block 214 and compared against $R_C$ at block 215. In some embodiments, the resistance is not actually measured, but simply compared against $R_C$ to see which is greater. If the resistance is greater than $R_C$, the low energy reset pulse was successful and the reset is complete at block 218. If the resistance is less than $R_C$, the low energy reset pulse was not successful and a high energy reset pulse that melts a significant portion of the phase change material, causing it to go to the amorphous phase, is sent to the PCM cell at block 216. The high energy reset pulse may be counted on to put the PCM cell into a high resistance state, so the reset is complete at block 218.

Figure 2C:
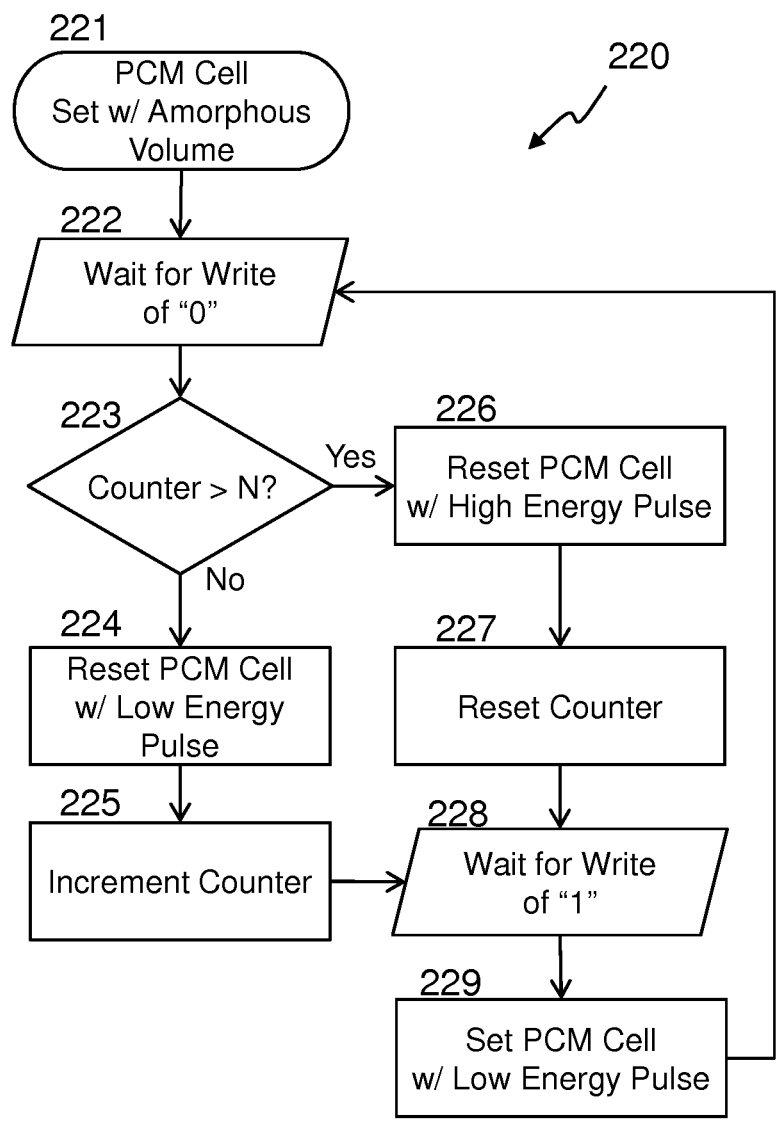

FIG. 2C shows a flow chart 220 of an alternate embodiment of a method using a low energy reset pulse for PCM cells. A previously set PCM cell with an amorphous volume of phase change material is available at block 221. A write to set the bit to "0" may be received at block 222 and it is determined that it is required to toggle the state of the PCM cell from set to reset. A controller element may manage a counter related to one or more PCM cells, keeping track of the number of times the PCM cell or cells have been reset. In some embodiments, the design of the PCM cell and/or circuitry to generate the low energy set and reset pulses may be such that the PCM cell may only be toggled a limited number of times before the PCM cell needs to be reconditioned with a high energy reset pulse to melt a significant portion of the volume of the phase change material and re-create an amorphous volume without fragments of conductive filaments. The number of reliable resets allowed for a particular memory part before it is reconditioned may be predetermined by design, using simulation, or by characterization of a process, lot or single device. In one embodiment, the predetermined number of resets may only be 60 while in another embodiment, 200 resets may be reliable and in further embodiments, a large number of resets (>10,000) may be allowable.

The value of the counter associated with the available PCM cell to be reset is checked at block 223. If the counter is not greater than the predetermined allowable number of resets (N), the PCM cell is reset using a low energy reset pulse at block 224 and the counter may be incremented at block 225. If the counter is greater than the predetermined allowable number of resets, the PCM cell is reset using a high energy reset pulse at block 226 and the counter is reset at block 227 so that the number of low energy resets performed after the most recent reconditioning can be counted. Once the PCM cell has been reset using either the low energy or high energy reset pulse, the flow chart 220 waits for the PCM cell to require a set cycle at block 228 due to a "1" being written to the PCM cell. In response to the write of a "1", a low energy set pulse is used to put the PCM cell into a low resistance state again at block 229. Then the flow chart 220 waits for the PCM cell to require a reset cycle once again back at block 222.

Figure 3:
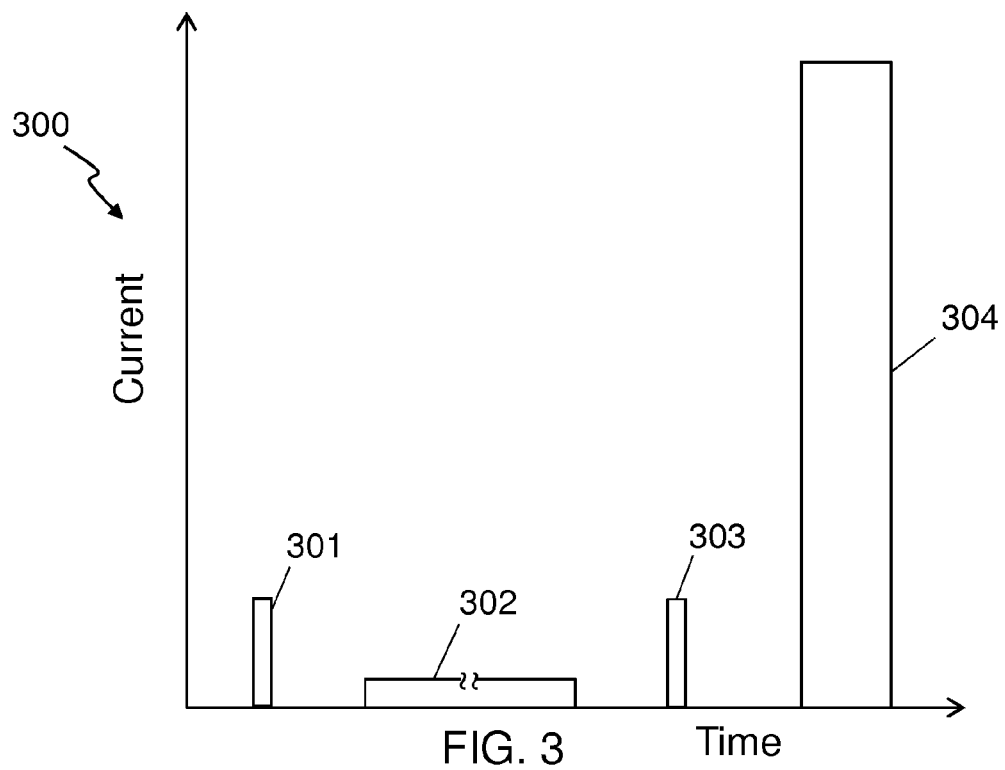
FIG. 3 shows a collection of pulses that may be used by various embodiments to reset and set PCM cells.

FIG. 3 shows a collection of pulses 301-304 that may be used by various embodiments to reset and set PCM cells. Low energy reset pulse 301 may be used if the PCM cell has been previously set using a low energy set pulse. The low energy reset pulse 301 may have an amplitude between about 200 μA and about 500 μA with a width of between about 5 ns and about 100 ns in many embodiments, although other embodiment may use lower or higher amplitudes and longer or shorter pulse widths. Other embodiments may involve a current amplitude of between about 20% and about 50% of the high energy reset pulse and a duration of between 50% and 100% of the high energy reset pulse. A high energy reset pulse is a pulse that can melt a significant portion (for example greater than about 10%) of the volume of the phase change material in the PCM cell. The embodiment shown in low energy pulse 301 may be about 300 μA for about 10 ns. The amount of energy involved for a low energy reset pulse to work properly depends on many design variables including, but not limited to, the type of phase change material, the geometry of the structures of the PCM cell, and the general design of the PCM device. In many embodiments, the current amplitude involved for the low energy reset pulse may be less than about 50% of the current amplitude of a high energy reset pulse that can melt a significant portion of the volume of the phase change material in the PCM cell.

At some point after the low energy reset pulse 301 has reset the PCM cell to a high resistance state, a low energy set pulse 302 may be used to set the PCM cell back to a low resistance state. The low energy set pulse 302 may have a wide range of amplitudes and durations, depending on the embodiment, but in most embodiments, the low energy set pulse 302 may have a current of between about 0.5% and about 20% of the high energy reset pulse with a pulse width ranging from the width of a low energy reset pulse to as much as about 1000 ns. In the embodiment shown, the low energy set pulse 302 may have an amplitude of about 75 μA and a width of about 500 ns (not to scale).

After the low energy set pulse has set the PCM cell into a low resistance state, another low energy reset pulse 303 may be used to attempt to set the PCM cell back to a high resistance state. The parameters of the low energy reset pulse 303 may be the same as low energy reset pulse 301, although some embodiments may vary the parameters of the low energy reset pulse between reset cycles.

As shown in FIGS. 2B and 2C, some embodiments may involve a high energy reset pulse 304 to recondition the PCM cell by melting a significant portion of the volume of the phase change material. The amplitude and duration of the high energy reset pulse 304 may vary widely based on the same implementation details described above. The high energy reset pulse 304 may have an amplitude of about 1.8 mA and a duration of about 50 ns although other embodiments may use amplitudes of between about 1.2 mA and about 2.5 mA with durations from about 20 ns to about 200 ns or greater. Future developments in phase change materials or other technologies may allow for high energy reset pulses of much lower energy, but it is expected that the low energy reset pulse techniques described herein will scale with the energy involved for a high energy reset pulse.

Figure 4:
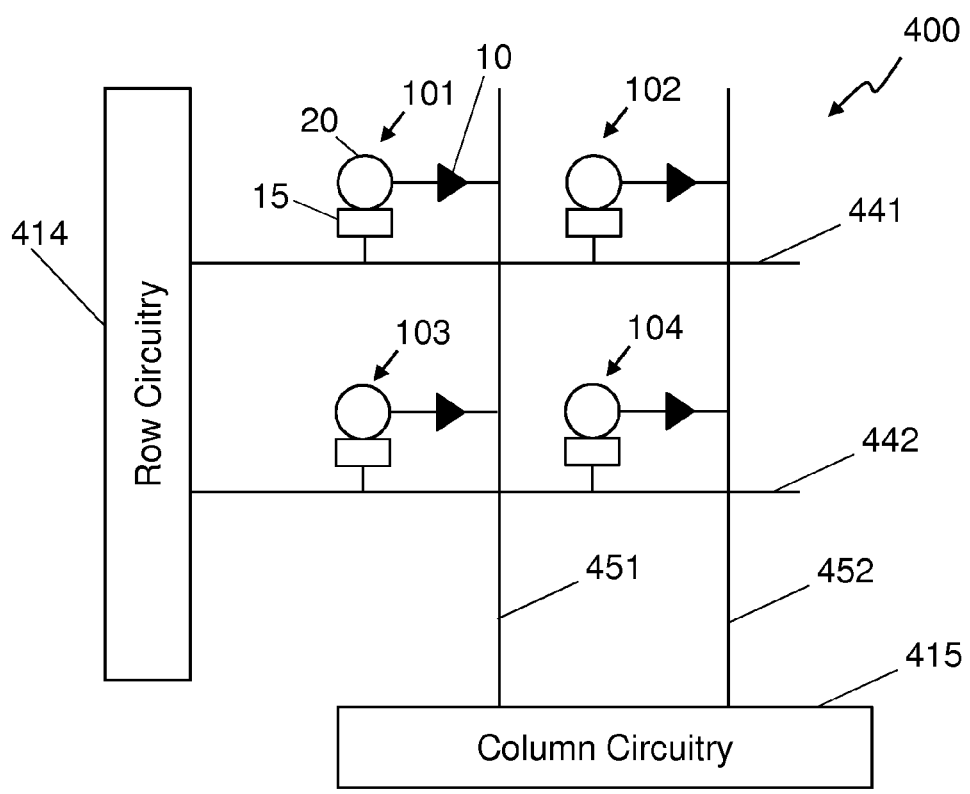
FIG. 4 shows an array of phase change memory cells including an access device for each cell and associated circuitry for various embodiments.

FIG. 4 shows an array 400 of phase change memory cells including an access device for each cell and associated circuitry 414, 415 for various embodiments. The array 400 shows four PCM cells 101-104 and associated switches 10 with two word lines 441, 441 and two bit lines 451, 452, although most embodiments may contain a much greater number of cells and associated word lines and bit lines. Each PCM cell 101-104 may have a heater element 15 and phase change material 20 and may be associated with an access device (or switch), such as the ovonic threshold switch (OTS) 10 as shown in the embodiment of FIG. 4. Embodiments including a switch with the PCM cell may be referred to as a phase change memory with switch (PCMS) device. Other embodiments may use a different type of access device such as, but not limited to, a diode, a transistor, or other device. Yet other embodiments may not include any access device. Some embodiments may not include the heating element 15. Other embodiments may replace the PCM cell with a resistive random access memory (RRAM) cell connected to an OTS and additional embodiments may use PCM cells without an access device. The layout of the array 400 may be important as the phase change material 20 may be positioned very close, and in thermal contact with the heater 15 (if included). The access device 10 may be electrically coupled between the word line 441 and the heater 15, or the access device 10 may be electrically coupled between the phase change material 20 and the bit line 451.

Row circuitry 414 may drive the word lines 441, 442 and column circuitry 415 may be coupled to the bit lines 451, 452. A particular combination of word line 441, 442 and bit line 452, 452 may select a particular PCM cell. For example, to select PCM cell 101, word line 441 and bit line 451 would be used. The row circuitry 414 and/or column circuitry 415 may implement several functions, depending on the embodiment. Different embodiments may implement the various functions in either the row circuitry 414 of the column circuitry 415 or may utilize both the row circuitry 414 and column circuitry 415 to implement a function.

Functions that may be implemented in the row circuitry 414 and/or column circuitry 415 include circuitry to provide a low energy reset pulse and circuitry to provide a low energy set pulse, such as low energy reset pulses 301, 303 and the low energy set pulse 302 shown in FIG. 3. Some embodiments may also provide circuitry to compare the resistance of the PCM cell against a critical resistance ($R_C$) and some embodiments may include circuitry to provide a high energy reset pulse such as the high energy reset pulse 304 shown in FIG. 3. Various embodiments may also provide circuitry to read the contents of the PCM cells by detecting a threshold voltage of the PCMS cell or resistance of the PCM cells. Details of the implementations may vary widely, depending on the embodiment, and should be easily understood by one of ordinary skill in the art.

In one embodiment, the row circuitry 414 may provide the current at the desired amplitude and/or duration for the pulses on the appropriate word line and the row circuitry may simply enable the appropriate bit line to sink the current while blocking current flow on the other bit lines. Resistance of a particular PCM cell may be compared against a critical resistance by providing a current sink on the appropriate bit line while providing a known current on the appropriate word line. The voltage on the word line can then be compared against a voltage equal to the voltage that would be generated by the critical resistance.

Figure 5:
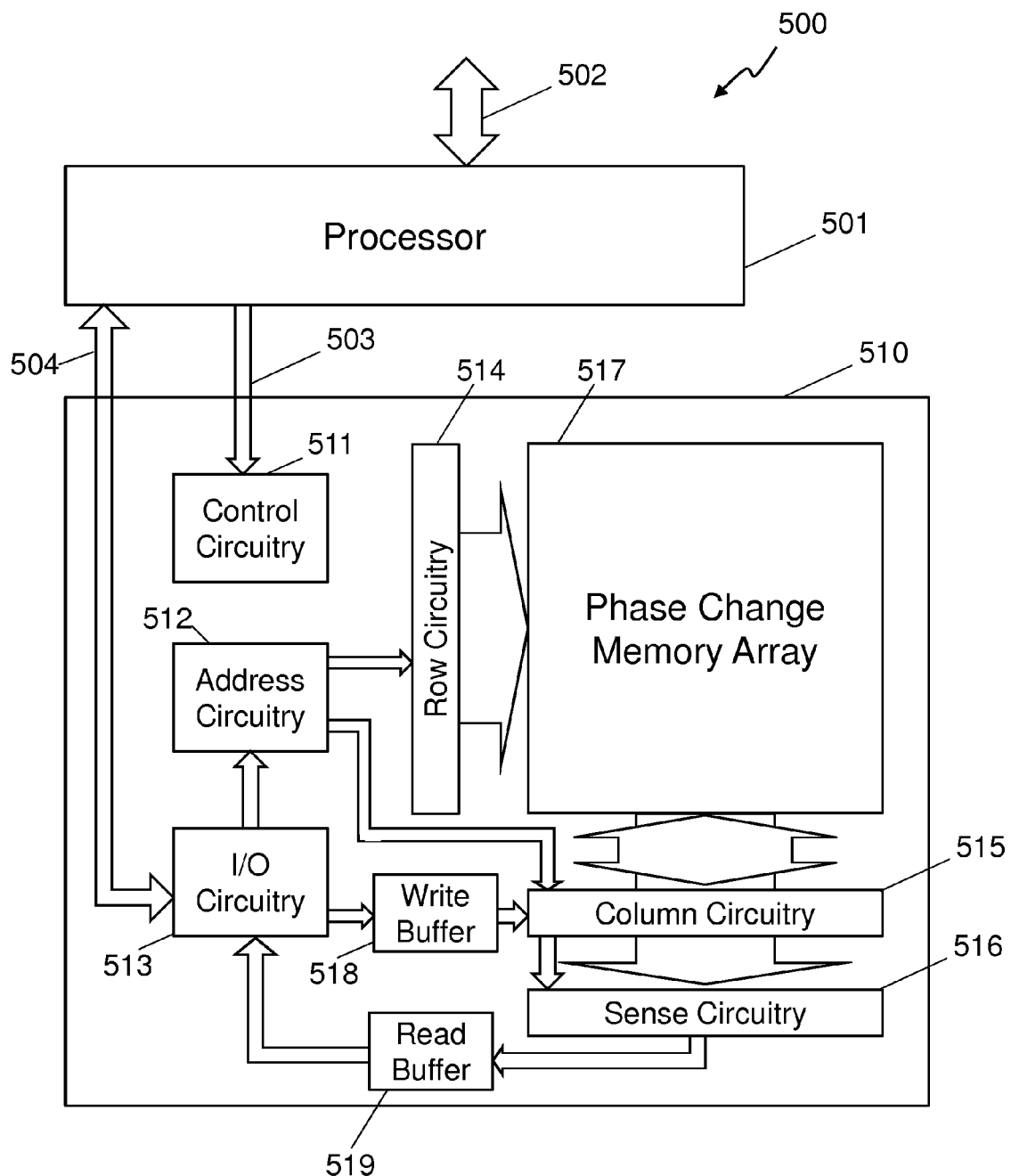
FIG. 5 shows an embodiment of a system utilizing a low energy reset pulse for PCM cells.

FIG. 5 shows a block diagram of an embodiment of a computing or storage system 500 comprising a processor 501 coupled to a memory device 510 with control lines 503 and data lines 504. In some embodiments, data and control may utilize the same lines. The processor 501 may be an external microprocessor, microcontroller, or some other type of external controlling circuitry. In some embodiments, the processor 501 may be integrated in the same package or even on the same die as the memory device 510. In some embodiments, the processor 501 may be integrated with the control circuitry 511, allowing some of the same circuitry to be used for both functions. The processor 501 may have external memory, such as RAM and ROM, used for program storage and intermediate data or it may have internal RAM or ROM. In some embodiments, the processor may use the memory device 510 for program or data storage. A program running on the processor 501 may implement many different functions including, but not limited to, an operating system, a file system, bad cell or block mapping, and error management The block diagram of computing or storage system 500 has been simplified to focus on features of the memory that are helpful in understanding this disclosure.

In some embodiments an external connection 502 is provided. The external connection 502 is coupled to the processor 501 and allows the processor 501 to communicate to external devices. In the case of a storage system, the external connection 502 may be used to provide an external device with non-volatile storage. The external connection 502 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

The memory device 510 includes an array 517 of phase change memory (PCM) cells as discussed herein. Each cell in the PCM array 517 includes a portion of phase change material and may optionally include a heater element and/or an access/isolation device such as a diode, metal oxide semiconductor (MOS) transistor, or ovonic threshold switch (OTS) device. The PCM array 517 may be arranged in banks of word line rows and bit line columns.

Address buffer circuitry 512 is provided to latch address signals provided through the I/O circuitry 513. Address signals are received, decoded by control circuitry which may control row circuitry 514 to drive word lines to the PCM array 517, at least during programming of the cells. Column circuitry 515 may be coupled to the bit lines. Circuitry to generate one or more of low energy set pulses, low energy reset pulses and high energy reset pulses may be included in the row circuitry and/or column circuitry for writing to the PCM array. It may be appreciated by those skilled in the art with the benefit of the present description that the number of address input connections depends on the density and architecture of the PCM array 517. That is, the number of addresses increases with both increased memory cell counts and increased bank and block counts.

The memory device 510 reads data in the PCM array 517 by sensing changes in threshold voltage or resistance of addressed PCM cells using sense circuitry 516. The sense circuitry 516, in one embodiment, is coupled to read and latch a row of data from the PCM array 517. Write buffers 518 may be used in some embodiments to accumulate data until a write can be performed and read buffers 519 may hold data read from the PCM array 517 until it can be sent out through the data lines 504. The I/O circuitry 513 routes the data through the I/O pins of the memory device 510.

Memory control circuitry 511 decodes commands provided on control lines 503 from the processor 501. Such commands are used to control the operations on the PCM array 517 including data read and data write (program) operations. The memory controller circuitry 511 may be a state machine, a sequencer, a processor, or some other type of controller to generate the voltage waveforms necessary to control the PCM array 517. The control circuitry 511 communicates with the other blocks in the memory device but those connections are not shown as they would overly complicate the block diagram 500 and one skilled in the art can understand that the control circuitry 511 has numerous interconnections with the other blocks in order to control their functions.

The system illustrated in FIG. 5 has been simplified to facilitate a basic understanding of the features of the memory. Many different embodiments are possible including using a single processor 502 to control a plurality of memory devices 510 to provide for more storage space. Additional functions, such as a video graphics controller driving a monitor, and other devices for human oriented I/O may be included in some embodiments. Furthermore, processor 501 may be configured by a program of instructions, for example software, to implement the claimed subject matter as discussed herein to control memory device 510 and its circuitry including phase change memory array 517. In such embodiments, the software may be tangibly embodied by patentable subject matter, excluding non-patentable subject matter, in or on an article of manufacture having instructions stored thereon that, if executed by a machine such as processor 501, to result in a method to set and/or reset one or more elements of phase change memory array 517 as described herein, although the scope of the claimed subject matter is not limited in this respect.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. More-over, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method comprising:
    initializing a phase change memory (PCM) storage element to a low resistance (set) state, wherein the PCM storage element in the set state comprises an amorphous volume of phase change material;
    resetting the PCM storage element to a high resistance (reset) state with a low energy reset pulse, wherein the low energy reset pulse does not melt a significant portion of the amorphous volume of phase change material in the PCM storage element;
    setting the PCM storage element to the low resistance (set) state using a low energy set pulse after the PCM storage element has been reset, wherein the PCM storage element in the set state comprises an amorphous volume of phase change material; and
    applying a high energy reset pulse to the PCM storage element to reset the PCM storage element to the reset state after a predetermined number of low energy reset and low energy set pulses have been applied to the PCM storage element, wherein the high energy reset pulse melts a significant portion of the phase change material in the PCM storage element.

2. The method of claim 1, wherein a conducting filament in the amorphous volume of phase change material in the PCM storage element in the set state is disrupted by the low energy reset pulse.

3. The method of claim 1, wherein a threshold voltage of the PCM storage element is increased by the low energy reset pulse.

4. The method of claim 3, wherein said threshold voltage of the PCM storage element in the reset state is increased to a level that is distinguishable from the set state.

5. The method of claim 1, wherein the low energy reset pulse has a current amplitude that is less than about 50% of a minimum current amplitude that is capable of melting a significant portion of the phase change material in the PCM storage element at the same duration as the low energy reset pulse.

6. The method of claim 1, further comprising:
    comparing a cell resistance of the PCM storage element to a critical resistance after the PCM storage element has been reset with the low energy reset pulse; and
    applying a high energy reset pulse to the PCM storage element if said cell resistance is less than the critical resistance, wherein the high energy reset pulse melts a significant portion of the phase change material in the PCM storage element.

7. A memory device comprising:
    a phase change memory (PCM) storage element in a low resistance (set) state, wherein the PCM storage element comprises an amorphous volume of phase change material and a conducting filament through the amorphous volume of phase change material; and
    circuitry to provide a low energy reset pulse to said PCM storage element; wherein said PCM storage element is reset to a high resistance (reset) state by the low energy reset pulse, and the low energy reset pulse disrupts the conducting filament and does not melt a significant portion of the amorphous volume of phase change material in said PCM storage element.

8. The memory device of claim 7 wherein said PCM storage element is electrically coupled to an access device.

9. The memory device of claim 7, wherein the low energy reset pulse has a current amplitude that is less than about 50% of a minimum current amplitude that is capable of melting a significant portion of the phase change material in the PCM storage element at the same duration as the low energy reset pulse.

10. The memory device of claim 7, further comprising:
    circuitry to compare a cell resistance of said PCM storage element to a critical resistance after said PCM storage element is reset by the low energy reset pulse; and
    circuitry to provide a high energy reset pulse to said PCM storage element if said cell resistance is less than the critical resistance, wherein the high energy reset pulse melts a significant portion of the phase change material in said PCM storage element.

11. The memory device of claim 7, further comprising:
    circuitry to provide a low energy set pulse to said PCM storage element, wherein the low energy set pulse sets said PCM storage element to the low resistance (set) state and said PCM storage element in the set state comprises an amorphous volume of phase change material.

12. The memory device of claim 11, further comprising:
    circuitry to provide a high energy reset pulse to said PCM storage element after a predetermined number of low energy reset/set cycles have been performed, wherein the high energy reset pulse melts a significant portion of the phase change material in said PCM storage element.

13. A system comprising:
    a processor and a memory device communicatively coupled to the processor, the processor being configured to read and write data to the memory device, the memory device comprising:
    a phase change memory (PCM) storage element in a low resistance (set) state, wherein the PCM storage element comprises an amorphous volume of phase change material and a conducting filament through the amorphous volume of phase change material; and
    circuitry to provide a low energy reset pulse to said PCM storage element; wherein said PCM storage element is reset to a high resistance (reset) state by the low energy reset pulse, and the low energy reset pulse disrupts the conducting filament and does not melt a significant portion of the amorphous volume of phase change material in said PCM storage element.

14. The system of claim 13, wherein the low energy reset pulse has a current amplitude that is less than about 50% of a minimum current amplitude that is capable of melting a significant portion of the phase change material in the PCM storage element at the same duration as the low energy reset pulse.

15. The system of claim 13, wherein the memory device further comprises:
    circuitry to compare a cell resistance of said PCM storage element to a critical resistance after said PCM storage element is reset by the low energy reset pulse; and
    circuitry to provide a high energy reset pulse to said PCM storage element if said cell resistance is less than the critical resistance, wherein the high energy reset pulse melts a significant portion of the phase change material in said PCM storage element.

16. The system of claim 13, wherein the memory device further comprises:
    circuitry to provide a low energy set pulse to said PCM storage element, wherein the low energy set pulse sets said PCM storage element to the low resistance (set) state and said PCM storage element in the set state comprises an amorphous volume of phase change material; and
    circuitry to provide a high energy reset pulse to said PCM storage element after a predetermined number of low energy reset/set cycles have been performed, wherein the high energy reset pulse melts a significant portion of the phase change material in said PCM storage element.

17. The method of claim 2, wherein the conducting filament has a cross-sectional area of about 1% or less of an area of the PCM storage element in contact with a heater element wherein current of the low energy reset pulse flows between the heater element and the PCM storage element.

18. The memory device of claim 7, further comprising a heater element in contact with an area of the PCM storage element to conduct current of the low energy reset pulse;
    wherein the conducting filament has a cross-sectional area of about 1% or less of the area of the PCM storage element in contact with a heater element.

19. The system of claim 13, the memory device further comprising a heater element in contact with an area of the PCM storage element to conduct current of the low energy reset pulse;
    wherein the conducting filament has a cross-sectional area of about 1% or less of the area of the PCM storage element in contact with a heater element.

* * * * *